United States Patent [19]
Shi et al.

[11] Patent Number: 6,075,316
[45] Date of Patent: Jun. 13, 2000

[54] FULL COLOR ORGANIC ELECTROLUMINESCENT DISPLAY DEVICE AND METHOD OF FABRICATION

[75] Inventors: Song Q. Shi, Phoenix; Franky So, Tempe; Thomas B. Harvey, III, Scottsdale, all of Ariz.; Hsing-Chung Lee, Calabasas, Calif.

[73] Assignee: Motorola, Inc., Schaumburg, Ill.

[21] Appl. No.: 08/990,282

[22] Filed: Dec. 15, 1997

[51] Int. Cl.$^7$ .................................................. H05B 33/00
[52] U.S. Cl. .......................... 313/504; 313/506; 313/509; 257/83; 257/99
[58] Field of Search .................................. 313/498, 503, 313/506, 509, 504; 345/30–110; 257/81, 83, 84, 88, 89, 99; 315/169.3

[56] References Cited

U.S. PATENT DOCUMENTS

| | | | |
|---|---|---|---|
| 4,143,297 | 3/1979 | Fischer | 313/509 |
| 5,469,019 | 11/1995 | Mori | 313/509 |
| 5,585,695 | 12/1996 | Kitai | 313/506 |
| 5,705,285 | 1/1998 | Shi et al. | 313/504 |
| 5,757,026 | 5/1998 | Forrest et al. | 257/88 |
| 5,773,931 | 6/1998 | Shi et al. | 313/509 |
| 5,834,130 | 11/1998 | Kido | 313/506 |
| 5,844,362 | 12/1998 | Tanabe et al. | 313/506 |
| 5,929,474 | 7/1999 | Huang et al. | 257/88 |
| 5,965,907 | 10/1999 | Huang et al. | 313/506 |

*Primary Examiner*—Ashok Patel
*Attorney, Agent, or Firm*—Eugene A. Parsons; William E. Koch

[57] ABSTRACT

A full color organic electroluminescent display device including a substrate element and a plurality of thin film transistors, formed on the substrate element. A planarizing layer of insulating material is positioned over the plurality of thin film transistors, thereby defining a substantially planar surface. A plurality of contact pads are formed on the planar surface of the planarizing layer, with one contact pad associated with each thin film transistor. A hole transporting layer is deposited over the contact pads. Three pixelated emissive organic electron transporting media are formed on a top surface of the hole transporting layer so as to define an organic light emitting device. An electrical and light conducting material is positioned in overlying relationship over the emissive organic electron transporting media, thereby operating as a common second terminal of the organic light emitting devices.

15 Claims, 1 Drawing Sheet

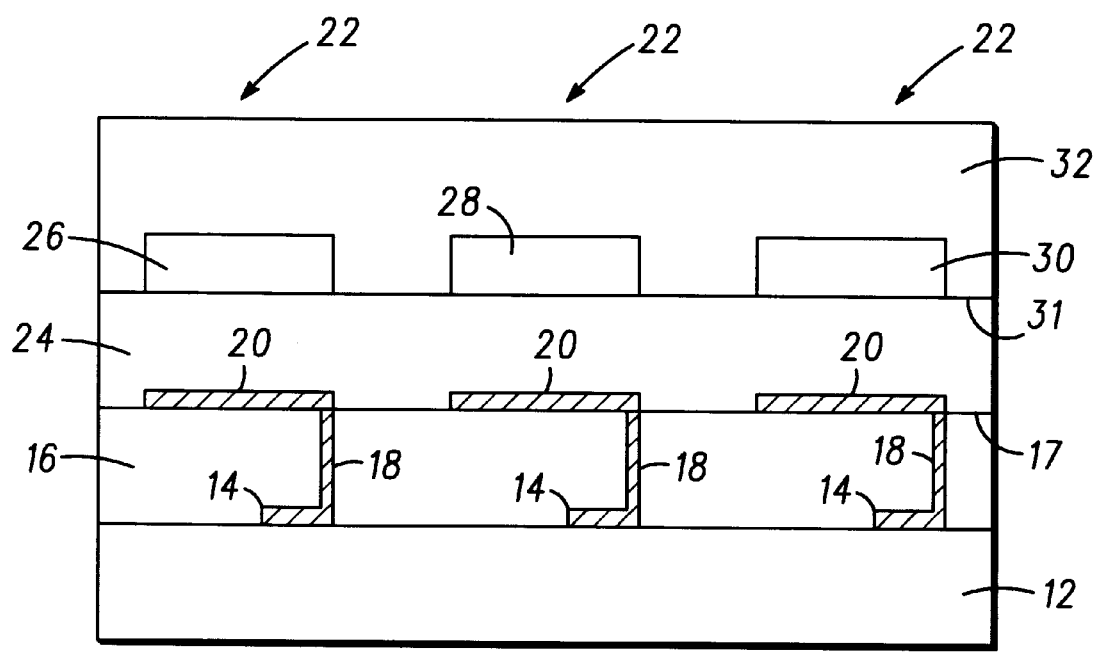

FULL COLOR ORGANIC ELECTROLUMINESCENT DISPLAY DEVICE AND METHOD OF FABRICATION

FIELD OF THE INVENTION

The present invention pertains to organic light emitting devices and more specifically to full color organic electroluminescent display devices and methods of fabrication.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display.

Organic light emitting diodes or organic electroluminescent devices (OLED or OED, hereinafter OED) and arrays thereof are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

Generally, OEDs include a first electrically conductive layer (or first contact), an electron transporting and emission layer, a hole transporting layer and a second electrically conductive layer (or second contact). Generally, the various layers must be positioned on a planar surface at least defining the extent of the OED. The light can be transmitted either way but must exit through one of the conductive layers. There are many ways to modify one of the conductive layers for the emission of light therethrough but it has been found generally that the most efficient LED includes one conductive layer which is transparent to the light being emitted. Also, one of the most widely used conductive, transparent materials is indium-tin-oxide (ITO), which is generally deposited in a layer on a transparent substrate such as a glass plate.

A major problem with OEDs is the fact that the various layers of each OED must be deposited on a planar surface, thus, complicating the integration of an active network into the array. If an active circuit for each pixel of the array is positioned adjacent and to one side of each pixel, for example, the fill factor, more particularly, the ratio of luminescent area to non luminescent area, for the array will be so poor it will produce unsatisfactory images.

Accordingly, it would be beneficial to provide a full color organic electroluminescent device for display applications which overcomes these problems.

It is a purpose of the present invention to provide a new and improved full color organic electroluminescent device for high information display applications.

It is another purpose of the present invention to provide a new and improved full color organic electroluminescent device with a high fill factor.

It is still another purpose of the present invention to provide a new and improved full color organic electroluminescent device which is easier and less expensive to fabricate and use.

It is a further purpose of the present invention to provide a new and improved full color organic electroluminescent device integrated onto a single substrate.

SUMMARY OF THE INVENTION

The above problems and others are at least partially solved and the above purposes and others are realized in full color organic electroluminescent display device including a substrate. A plurality of thin film transistors are formed on the substrate. A planarizing layer of insulating material is positioned over the plurality of thin film transistors in an array area and defines a substantially planar surface. A plurality of contact pads are formed on the planar surface of the planarizing layer, one contact pad associated with each thin film transistor of the plurality of thin film transistors. An organic electroluminescent media capable of emitting three primary colors (red, green and blue) of light are sequentially formed by thermal transferring technique. The organic electroluminescent media are in overlying relationship on the contact pads so as to define an OED on each contact pad with each contact pad operating as a first terminal of an overlying OED. A layer of electrical conductive material is positioned in overlying relationship over the layers of organic electroluminescent media and operates as a common second terminal of the OEDS.

BRIEF DESCRIPTION OF THE DRAWING

The single FIGURE is a simplified sectional view of a full color organic electroluminescent device in accordance with the present invention.

DESCRIPTION OF THE PREFERRED EMBODIMENTS

Referring specifically to FIGURE, illustrated is a simplified sectional view of a full color organic electroluminescent device 10 in accordance with the present invention. Device 10 is fabricated on a first substrate 12 which may be fabricated on any of the number of known materials employed in the art. For example, substrate 12 may be fabricated of a glass, such as a Corning 7059 glass, transparent plastic substrates, made of polyolefins, polyethersulfones, polyarylates, a semiconductor wafer, including silicon, gallium arsenide, silicon carbide, sapphire, or the like. A plurality of thin film transistors 14 (TFTs, 3 of which are illustrated) are formed on substrate 12 using conventional processing techniques. One TFT 14 is provided per each pixel off the display device 10. It should be understood that TFT 14 may consists of more than one transistors and may also have other electrical elements such as capacitors incorporated. The complexity of TFT 14 is dependent on specific applications. TFTs 14 serve as the drivers for the proposed display.

A planarizing layer 16 of a dielectric medium, which in this specific example includes a layer of silicon oxide ($SiO_2$), is positioned over thin film transistors 14 so as to define a substantially planar surface 17. Planarizing layer 16 can be formed by any convenient process including, for example, a CMP process. Openings 18 are formed through planarizing layer 16 in communication with a source contact of each TFT 14. A plurality of contact pads 20 are formed on planar surface 17 of planarizing layer 16 in an array, one to define each pixel in the array. As will be understood presently, the size and shape of each contact pad 20 determines the size and shape of the light emitting area of each pixel in the array. Also, the openings 18 through planarizing layer 16 are filled with electrical conductive materials to electrically connect each contact pad 20 with the source or drain of the TFT 14 beneath each contact pad 20. In this embodiment contact pads 20 are made of either transparent conductors such as indium-tin-oxide (ITO) or metals selected from silver, gold, aluminum, copper, indium, magnesium, lithium, or a combination thereof.

On the top of the contact pads 20, three pixelated organic electroluminescent media capable of emitting three primary colors (red, green and blue) of light are sequentially formed in a side by side fashion. The organic electroluminescent media are in overlying relationship on the contact pads so as to define an OED on each contact pad with each contact pad operating as a first terminal of an overlying OED.

In this invention, the organic electroluminescent media are formed by a thermal transferring printing technique. For thermal transfer printing, a mixture of organic electroluminescent materials and a curable polymeric binder are first coated on a thermal transfer sheet by conventional coating techniques. The organic electroluminescent materials together with the polymeric binder are thermally transfer-printed onto the designated area (in this embodiment, contact pad 20) with the aid of pressure, heat or light, or a combination of above. After thermal or photo-radiation curing, a layer of organic electroluminescent media is formed with stable profile on the top of contact pads 20.

In one embodiment, the organic electroluminescent media are formed of one single layer of organic materials comprising of a host organic material capable of transporting both electrons and holes, a guest fluorescent dye capable of emitting one of the primary colors of light (e.g. red, green and blue) and a curable polymeric binder. In practice, the first pixel of organic electroluminescent media capable of emitting the first primary color of light is formed on the first contact pad 20 by thermal transfer-printing, followed by a further thermal or photo-curing process to ensure the integrity of the pixel, and to prevent any pixel damage from following-up processes. Then, the second pixel of organic electroluminescent media capable of emitting the second primary color of light is transfer-printed on the second contact pad 20. After curing the second pixel, the third pixel of emitting the third primary color of light is formed.

In an alternative embodiment, the organic electroluminescent media are formed of a plurality of layers of organic materials. In a specific example, the organic electroluminescent media are comprised of one layer of hole transporting materials and one layer of emissive electron transporting materials.

In practice, the first layer of hole transporting medium 24, is formed as a blanket film covering the entire array area. Hole transporting medium 24 includes an organic hole transporting material such as aromatic tertiary amines in a curable binder. Hole transporting medium 24 includes organic tertiary aromatic amines having a general structure of:

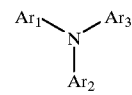

where: $Ar_1$, $Ar_2$ and $Ar_3$ are independently aromatic hydrocarbons or aromatic tertiary amine moieties. The aromatic hydrocarbons and the aromatic tertiary amine moieties in turn can be substituted. Typical substituents includes alkyl groups, alkoxy groups, alkylamine groups, aryl groups, aryloxy groups, arylamine groups, sulfonate group, carboxylate group and halogen such as bromide, chloride, and fluoride.

The following is a partial list of a few classes of aromatic tertiary amines satisfying the requirement of the present invention for hole transporting medium 24:

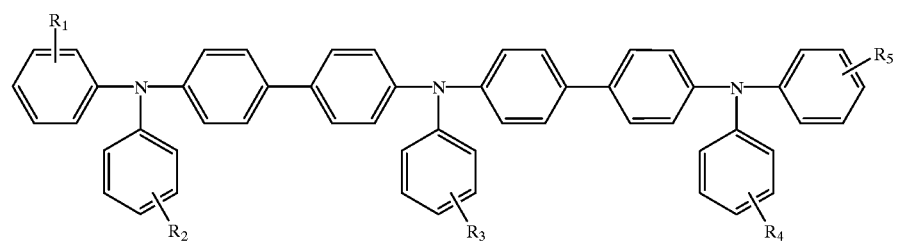

Class-1

Class-2
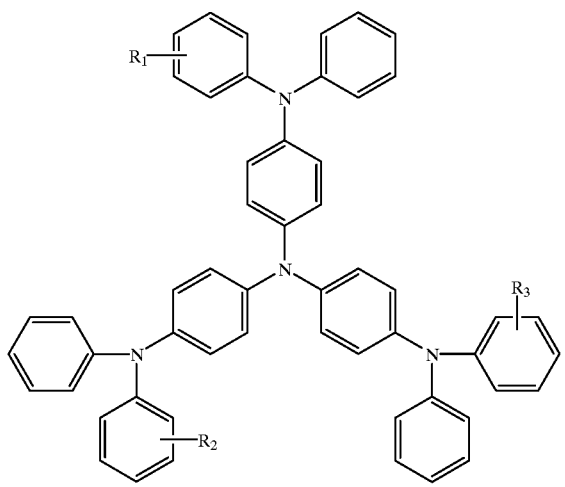
Class-3
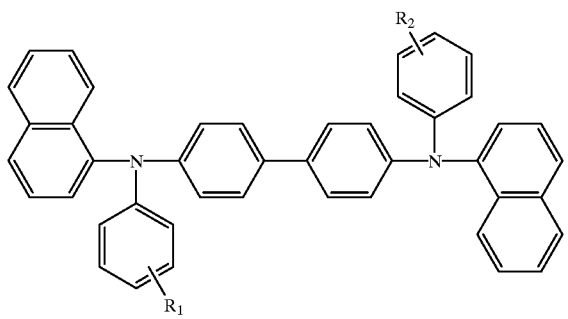
Class-4
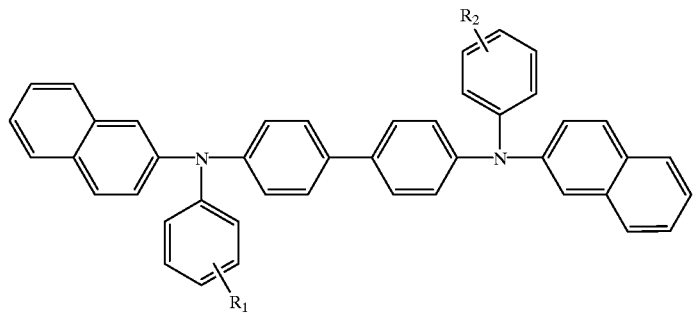
Class-5
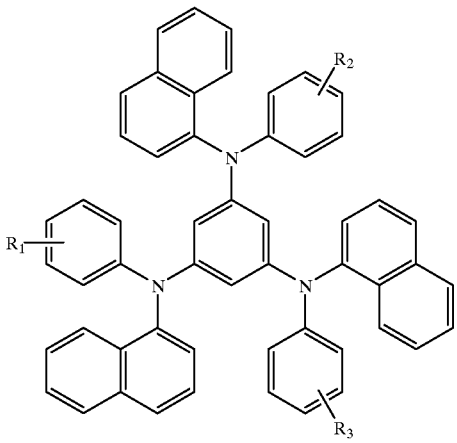

Where $R_1$, $R_2$, $R_3$, $R_4$ and $R_5$ are independently selected from alkyl groups, alkoxy groups, alkylamine groups, aryl groups, aryloxy groups, arylamine groups, sulfonate group, carboxylate group and halogen such as bromide, chloride, and fluoride; and $R_1$, $R_2$, $R_3$, $R_4$ and $R_5$ may also be independently a fused aromatic ring.

Though at the present time, the most reliable organic EL devices are fabricated mainly with the previously discussed aromatic tertiary amines as hole transporting materials, other organic hole transporting materials such as aromatic silanes, aromatic silazanes and aromatic phosphine can also be used in the present invention as hole transporting medium 24 as long as those materials have a Tg greater then 75° C.:

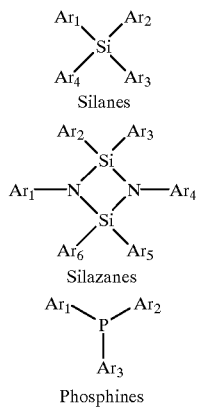

Silanes

Silazanes

Phosphines where: $Ar_1$, $Ar_2$ and $Ar_3$ are independently aromatic hydrocarbons or aromatic tertiary amine moieties. The aromatic hydrocarbons and the aromatic tertiary amine moieties in turn can be substituted. Typical substituents include alkyl groups, alkoxy groups, alkylamine groups, aryl groups, aryloxy groups, arylamine groups, sulfonate groups, carboxylate groups and halogen such as bromide, chloride, and fluoride.

Hole transporting medium 24 is thermally transfer-printed or even coated onto contact pads 20, the first electrodes, and the exposed regions of planerizing dielectric medium 16. Next, hole transporting medium 24 is cured. Subsequent to curing, three pixelated emissive organic electron transporting media 26, 28, and 30, each including organic electron transporting materials and one specific fluorescent dye (red, green or blue) in a binder, are formed parallel to each other on a top surface 31 of hole transporting medium sequentially by thermal transfer technology. Pixelated emissive organic electron transporting media 26, 28 and 30 are aligned with the respective underneath first electrodes, or contact pads 20.

It will of course be understood that additional or fewer organic layers may be utilized and the sequence of formation of the hole transporting and the electron transporting layers may also be reversed, depending upon the specific type and application of the OEDs.

After the formation of pixelated organic electroluminescent media 26, 28, and 30, an electrical conducting material is positioned in overlying relationship on the surface of organic electroluminescent media to operate as a common second terminal, or second electrode 32, of OEDs 22. In this embodiment, the second terminal may be made of transparent conductors such as indium-tin-oxide (ITO) or metals selected from silver, gold, aluminum, copper, indium, magnesium, lithium, or a combination thereof Practically, light generated from the disclosed device can come out either from the top or the bottom of the device depending on the substrate used. If an opaque substrate such as a silicon wafer is used, light will need to come out from the top. However if a transparent substrate such as glass is used, the emitted light may come out of both top and bottom directions. If one terminal is made of transparent conductors such as ITO, the other terminal will be preferred to be made of metals.

To improve the carrier injection efficiency, a thin layer of alkaline metal fluorides such as LiF, MgF2 or metal oxides such as LiOx, MgO, CsOx is often used in combination with metals such as aluminum, silver, gold, copper, indium to serve as one of the terminals. In one preferred embodiment, one terminal is made of ITO, the other terminal is made of a thin layer of LiF (1–20 Å thick) and aluminum (100–10,000 Å thick).

It should be understood that the organic electroluminescent media conduct current chiefly in the vertical direction, thereby generating a high fill factor i.e. directly between contact pads 20 and second contact 32 so that the light emission area of each OED 22 is defined substantially by the underlying contact pad 20 and pixelated emissive organic electron transporting media 26, 28 and 30.

Thus, a new and improved full color organic electroluminescent device has been disclosed with a high fill factor which is easier and less expensive to fabricate and use. The new and improved full color organic electroluminescent device includes an array of OEDs, fabricated onto a single substrate using thermal transfer technology.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A full color organic electroluminescent display device comprising:

a substrate element;

a plurality of thin film transistors, formed on the substrate element;

a planarizing layer of a dielectric material positioned over the plurality of thin film transistors and defining a substantially planar surface;

a plurality of contact pads formed on the planar surface of the planarizing layer, one contact pad associated with each thin film transistor of the plurality of thin film transistors and coupled to the associated thin film transistor by an opening through the planarizing layer;

at least one layer of organic material sequentially formed in overlying relationship on the contact pads so as to define an organic light emitting device on each contact pad with each contact pad operating as a first terminal of an overlying organic light emitting device; and electrical and light conducting material positioned in overlying relationship over the at least one layer of organic material and operating as a common second terminal of the organic light emitting devices.

2. A full color organic electroluminescent display device as claimed in claim 1 wherein the substrate element includes one of glass, polyethersulfones, polyarylates, silicon wafer, GaAs, SiC, and sapphire.

3. A full color organic electroluminescent display device as claimed in claim 2 wherein the planarizing layer of dielectric medium includes silicon oxide ($SiO_2$).

4. A full color organic electroluminescent display device as claimed in claim 1 wherein the at least one layer of organic material includes a hole transporting layer and at least three pixelated emissive organic electron transporting media sequentially formed in overlying relationship.

5. A full color organic electroluminescent display device as claimed in claim 4 wherein the hole transporting layer includes one of a thermal and photo-curable binder.

6. A full color organic electroluminescent display device as claimed in claim 1 wherein the plurality of contact pads include transparent indium-tin-oxide (ITO).

7. A full color organic electroluminescent display device as claimed in claim 1 wherein common second terminal of the organic light emitting devices includes a thin layer of gold and a layer of indium-tin-oxide.

8. A full color organic electroluminescent display device as claimed in claim 1 wherein the common second terminal of the organic light emitting devices includes a thin layer of one of magnesium and lithium-silver and a layer of indium-tin-oxide sequentially formed in overlying relationship.

9. A full color organic electroluminescent display device comprising:
   a semiconductor substrate element having an array area defined thereon;
   a plurality of thin film transistors, formed on the semiconductor substrate element;
   a planarizing layer of insulating material positioned over the plurality of thin film transistors and defining a substantially planar surface;
   a plurality of contact pads formed on the planar surface of the planarizing layer, one contact pad associated with each thin film transistor of the plurality of thin film transistors and coupled to the associated thin film transistor through a plurality of openings in the planarizing layer;
   a layer of hole transporting medium formed as a blanket layer of over the plurality of contact pads and a plurality of exposed regions of the planarizing layer;
   at least three pixelated emissive organic electron transporting media, each including organic electron transporting materials and one specific fluorescent dye in a binder material, placed parallel to each other on a top surface of the layer of hole transporting medium, the at least three pixelated emissive organic electron transporting media formed in overlying relationship on the contact pads so as to define an organic light emitting device on each contact pad with each contact pad operating as a first terminal of an overlying organic light emitting device; and
   an electrical and light conducting material positioned in overlying relationship over the at least three pixelated emissive organic electron transporting media and operating as a common second terminal of the organic light emitting devices, the electrical and light conducting material including one of a layer of gold and indium-tin-oxide, a layer of magnesium and lithium-silver, and a layer of indium-tin-oxide sequentially formed in overlying relationship.

10. A full color organic electroluminescent display device as claimed in claim 9 wherein the semiconductor substrate element includes one of glass, polyethersulfones, polyarylates, silicon wafer, GaAs, SiC, and sapphire.

11. A full color organic electroluminescent display device as claimed in claimed in claim 10 wherein the planarizing layer of insulating material is a dielectric medium.

12. A full color organic electroluminescent display device as claimed in claim 11 wherein the planarizing layer of dielectric medium includes silicon oxide ($SiO_2$).

13. A full color organic electroluminescent display device as claimed in claim 9 wherein the hole transporting layer includes one of a thermal and photo-curable binder.

14. A full color organic electroluminescent display device as claimed in claim 9 wherein the plurality of contact pads include transparent indium-tin-oxide (ITO).

15. A full color organic electroluminescent display device as claimed in claim 9 wherein the at least three pixelated emissive organic electron transporting media include a first emissive organic electron transporting media emitting light of a first color, a second emissive organic electron transporting media emitting light a second color, different than the first color and a third emissive organic electron transporting media emitting light a third color, different than the first color and the second color.

* * * * *